(12) United States Patent
Chung

(10) Patent No.: US 6,428,650 B1
(45) Date of Patent: Aug. 6, 2002

(54) COVER FOR AN OPTICAL DEVICE AND METHOD FOR MAKING SAME

(75) Inventor: Kevin Kwong-Tai Chung, Princeton Township, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 2 days.

(21) Appl. No.: 09/633,791

(22) Filed: Aug. 7, 2000

Related U.S. Application Data

(63) Continuation-in-part of application No. 09/232,936, filed on Jan. 9, 1999, now Pat. No. 6,136,122.
(60) Provisional application No. 60/090,295, filed on Jun. 23, 1998, provisional application No. 60/092,170, filed on Jul. 9, 1998, and provisional application No. 60/198,705, filed on Apr. 20, 2000.

(51) Int. Cl.[7] .......................... B32B 31/18; C09J 11/00; H01L 21/463; H01L 31/0232; H05K 5/06
(52) U.S. Cl. ...................... 156/250; 156/257; 156/277; 156/295; 156/69; 438/113; 438/116; 438/118; 438/144; 174/50.51; 174/52.3; 257/434; 250/239
(58) Field of Search ................................ 156/235, 240, 156/241, 248, 250, 257, 265, 268, 277, 280, 291, 295, 69; 432/113, 114, 116, 118, 128; 174/50.51, 52.3; 257/81, 87, 433, 434, 264; 250/208.1, 214 R, 239

(56) References Cited

U.S. PATENT DOCUMENTS

| 2,014,524 A | 9/1935 | Franz |
| 2,774,747 A | 12/1956 | Wolfson et al. |
| 3,401,126 A | 9/1968 | Miller et al. |
| 3,429,040 A | 2/1969 | Miller |
| 4,113,981 A | 9/1978 | Fujita et al. |

(List continued on next page.)

FOREIGN PATENT DOCUMENTS

WO    PCT/US99/13738    10/1999

OTHER PUBLICATIONS

P. scharf, T. Coleman and K. Avellar, "Flip Component Technology", IEEE Electronic Component Conference (1967), pp. 269–274.

Gilleo, K: "Direct Chip Interconnect Using Polymer Bonding", IEEE 39th Electronic Component Conference, May. 1989, pp. 37–44.

R. Lachance, H. Lavoie, A. Montanari, "Corrosion/Migration Study of Flip Chip Underfill and Ceramic Overcoating", IEEE Electronic Components and Technology Conference (1997), pp. 885–889.

T. Y. Wu, Y. Tsukada, W. T. Chen, "Materials and Mechanics Issues in Flip–Chip Organic Packaging", IEEE Electronic Components and Technology Conference, (1996) pp. 524–534.

B. Rosner, J. Liu, Z. Lai, "Flip Chip Bonding Using Isotopically Conductive Adhesives", Electronic Components and Technology Conference, (1996) pp. 578–581.

(List continued on next page.)

Primary Examiner—J. A. Lorengo
(74) Attorney, Agent, or Firm—Dann, Dorfman, Herrell and Skillman, P.C.

(57) ABSTRACT

An optical device is enclosed within a package or module having an optically transmissive or transparent cover that is sealed with an adhesive preform that has been pre-applied onto the bonding areas of the cover. The adhesive preforms are formed of a wet adhesive deposited on a sheet of optically transmissive or transparent material as a preform in predetermined locations and are B-staged or dried to form dry solid adhesive preforms. The preforms may be continuous or have one or more small gaps therein. The sheet of optical material is diced or singulated to produce individual optical covers having an adhesive preform thereon.

34 Claims, 5 Drawing Sheets

U.S. PATENT DOCUMENTS

| | | |
|---|---|---|
| 4,395,184 A | 7/1983 | Braden |
| 4,442,966 A | 4/1984 | Jourdain et al. |
| 4,793,883 A | 12/1988 | Sheyon et al. |
| 4,833,102 A * | 5/1989 | Byrne et al. ............... 228/121 |
| 5,046,415 A | 9/1991 | Oates |
| 5,056,296 A | 10/1991 | Ross et al. |
| 5,074,947 A | 12/1991 | Estes et al. |
| 5,196,371 A | 3/1993 | Kulesza et al. |
| 5,237,130 A | 8/1993 | Kulesza et al. |
| 5,383,997 A | 1/1995 | Minowa et al. |
| 5,539,153 A | 7/1996 | Schwiebert et al. |
| 5,575,956 A * | 11/1996 | Hermansen et al. ........ 252/514 |
| 5,611,140 A | 3/1997 | Kulesza et al. |
| 5,622,585 A | 4/1997 | Minowa et al. |
| 5,667,884 A | 9/1997 | Bolger |
| 5,932,875 A | 8/1999 | Chung et al. |
| 5,950,074 A * | 9/1999 | Glenn et al. ............... 438/121 |

OTHER PUBLICATIONS

D. Gamota, C. Melton, "Advanced Encapsulant Materials Systems for Flip Chip", Advancing Microelectronics (Jul./Aug. 1997) pp. 22–24.

R. W. Johnson, D. Price, D. Maslyk, M. Palmer, S. Wentworth, C. Ellis, "Adhesive Based Flip Chip Technology for Assembly on Polyimide Flex Substrates", IEEE International Conference on Multichip Modules, 1997, pp. 81–86.

L. Schaper, K. Maner, S. Ang, "Reliability of Large Conductive Polymer Flip Chip Assemblies for Multichip Modules (MCMs)", IEEE International Conference on Multichip Modules (1997), pp. 87–91.

Dr. V. Ozguz, R. DeLosReyes, Dr. K. Chung, Dr. J. Licari, "Flexible Conductive Adhesive Bumps for Chip Scale Packaging", The Technical Conference At Chip Scale International, May. 1998, pp. 15–19.

K. Chung, V. Ozguz, "Flexible Conductive Adhesive as Solder Replacement in Flip Chip Interconnection", Proceedings Semicon West 1998, Jul. 1998, pp. 1–14.

"Cost effective Solutions for Advanced Semiconductor Interconnection and Packaging", Al Technology, Inc. Jul. 1998.

* cited by examiner

COVER FOR AN OPTICAL DEVICE AND METHOD FOR MAKING SAME

This application is a continuation-in-part of U.S. patent application Ser. No. 09/232,936 filed Jan. 9, 9994, now U.S. Pat No. 6,136,128 (which claims the benefit of U.S. Provisional Applications Ser. No. 60/090,295 filed Jun. 23, 1998, now expired and No. 60/092,170 filed Jul. 9, 1998, now expired), and claims the benefit of U.S. Provisional Application Ser. No. 60/198,705 filed Apr. 20, 2000, now expired.

The present invention relates to an adhesive preform cover and, in particular, to an adhesive preform cover for an optical device and a method for making such cover.

Many approaches have been tried for packaging electronic devices for protection against external hazards, such as handling and other mechanical damage, environmental factors, chemical attacks, and other potentially adverse elements. Depending on both the functional and aesthetic requirements, these electronic devices are typically packaged in several levels of packaging. The outermost level is most likely a housing or enclosure for the equipment of which such devices are a part.

Generally, a useful electronic device, such as electronic circuit or integrated circuit, is packaged within a small package or module providing the first of at least several levels of protection. Electronic devices such as semiconductor devices are often protected by solid organic encapsulation. When several of these packaged electronic devices are put together as a functional unit, such as in an electronic circuit module or on a printed circuit board or other substrate, they are often protected with an exterior lid, cover or other enclosure to form a protective housing. These exterior lids or covers may be attached with adhesive, solder, or by mechanical fasteners, such as screws, bolts and clips.

In some applications, an electronic device at the semiconductor device level may not be able to reliably be encased in a solid encapsulant because of the adverse influence of stresses induced in the device owing to direct contact with the encapsulant. In other applications, the use of the encapsulation may be too costly. In still other applications, there may be a need for a lid or cover that is electrically conductive so as to provide shielding against electromagnetic interference (EMI) which may originate in the covered device or which may originate externally and to which the covered device may be susceptible. In this type of EMI-resistant application, the lid must be electrically conductive and must also be connected to the electrical ground of the electronic device. This requirement cannot be easily met with either an insulating organic encapsulant which does not provide shielding or with a conductive encapsulant which is likely to electrically short the electronic device or the conductors connecting thereto. Even the use of an electrically conductive lid that is soldered in place may be inconvenient or impractical because of the adverse effects on the devices that result from the high temperatures required for making soldering attachments. In addition, if one needs to rework the soldered module, the de-soldering operation may also cause overheating or other damage or the inadvertent de-soldering of other electronic elements inside of the package.

In fact, most of the electronic devices utilized in aerospace, military and other high reliability applications make use of a hermetically-sealed lid to prevent moisture and other adverse elements from affecting or damaging the electronic components employed therein. However, true hermetically-sealed packages are very expensive to fabricate, especially for optical devices requiring an optically transparent cover. Most high-reliability hermetically-sealed packages employ either metal soldering or brazing for lid attachment, especially for applications requiring an electrically conductive housing for EMI protection. In those applications where an insulating lid or cover must be employed, high temperature glass seals are often utilized. In order to prevent damage to the electronic devices from the high-temperature processing necessary to form the glass seals, the packages and lids must be heated up locally only along the rim of the package and lid. As a result, the processing time is long and the work of attaching the protective lids is delicate. In addition, the materials employed in both the glass seal and lid must have respective coefficients of thermal expansion (CTE) that are matched to that of the electronic substrate or package to which they attach. This additional requirement of matching the respective CTEs of the substrate, sealing material, and lid, all increase the difficulty of package design and the cost of the finished device. In general, the cost of both the materials and the processing of matched-CTE packages are prohibitive for commercial electronics products for general use, such as consumer electronic products.

Electronic package lids and covers are used, however, to a certain extent in commercial electronics products where required to achieve necessary performance parameters. For example, optical devices that must receive light in the visible, ultra-violet and/or infrared spectra cannot be simply encapsulated and so are protected by a lid that is transparent to such light. These lids are generally attached with adhesive.

Conventionally, adhesive in the form of dispensable paste or a die-cut preform is applied to the device or to the lid or cover immediately before or as part of the lid attachment bonding process. In certain cases, for, example, when the number of lid attachments is high, lids are pre-coated with adhesive or with die-cut adhesive preforms that will flow and cure when applied under heat and pressure conditions during the lid attachment process. However, the cost of adhesive pre-coating and die cut adhesive preform application to lids and covers is still quite high, in part due to the number of steps required and the handling of individual lids and even individual adhesive preforms. Adhesives in liquidous form are typically dispensed with a programmable automatic dispenser or are roller-coated onto the sealing areas of each lid, and are then subsequently dried or B-staged at a temperature and for a time substantially lower than the specified curing temperature and time for the particular adhesive. The liquidous adhesive is thus changed into a solid state either through solvent evaporation or chemical cross-linking of the adhesive during this drying or B-staging.

U.S. Pat. No. 5,056,296 issued to Ross et al and entitled "Iso-Thermal Seal Process for Electronic Devices" discloses an apparatus and process wherein the apparatus heats the lid, the package and the surrounding thermosetting adhesive so that they all attain an isothermal condition, i.e. a uniform temperature, before the lid is mated to the package in the bonding process. The Ross et al patent describes the pre-sealing isothermal condition as necessary to prevent differential air pressure between the inside and outside of the package that can cause "blow-out"-induced pinholes along the bond line provided by the sealing thermosetting adhesive if the parts are brought together and then are heated. Because of the time required to raise the temperature of the lid and the package, perhaps several minutes to achieve uniform temperature, the Ross et al process would appear able to achieve significant quantity production only when applied in a batch processing of lids, which often is impracticable. Moreover, because of the long heating time, the Ross et al process would seem to require a slower curing adhesive so as to avoid gelling or partial curing of the pre-heated adhesive before attachment of the lid to the package, thereby also extending the post-attachment curing time of the adhesive and further reducing the ability to achieve quantity production.

Thus, there is a need for an efficient method of pre-coating and pre-applying adhesive preforms onto lids and covers for optical devices to provide a cost-effective solution for protecting such devices. It is also desirable that such method lend itself to automated processing and that the adhesive of the preform be removable at a temperature and an applied force that will not damage either the optical/electronic components inside the package and/or the substrate to which they are attached.

There is also a need for such lids and covers that also provide shielding against EMI and that can be attached at a temperature substantially below the general soldering temperature of about 220° C. It is also desirable that the adhesive employed therein is electrically conductive and bonds essentially instantly upon reaching the bonding temperature, and that the lids or covers so attached be removable at a temperature below the general soldering temperature so as to eliminate the possibility of thermally-induced damage to or misalignment of components inside the package.

According to the invention, a cover for an optical device comprises a planar sheet of an optically transmissive material having a central region shaped and sized to be at least as large as an optical device to be covered and having a peripheral region surrounding the central region. A closed bonding pattern of adhesive in the peripheral region of the planar sheet of optically transmissive material has at least one gap therein, the width of the gap being sufficiently small as to close when the adhesive is caused to melt flow.

In another aspect, the method of the present invention for making optical covers comprises:

providing an optical substrate;

depositing a pattern of adhesive including a plurality of cover bonding patterns on the optical substrate; and singulating the optical substrate into a plurality of optical covers each of which has one of the cover bonding patterns of adhesive attached thereto.

According to a further aspect of the invention, a method for making an optical cover comprises:

providing sheet of an optical substrate material that is one of optically transmissive and optically transparent;

depositing a pattern of adhesive including a plurality of cover bonding patterns on the sheet of optical substrate material;

drying or B-staging the deposited pattern of adhesive; and singulating from the sheet of optical substrate material at least one optical cover which has one of the cover bonding patterns of adhesive attached thereto.

BRIEF DESCRIPTION OF THE DRAWING

The detailed description of the preferred embodiments of the present invention will be more easily and better understood when read in conjunction with the FIGURES of the Drawing which include.

Figure 1:
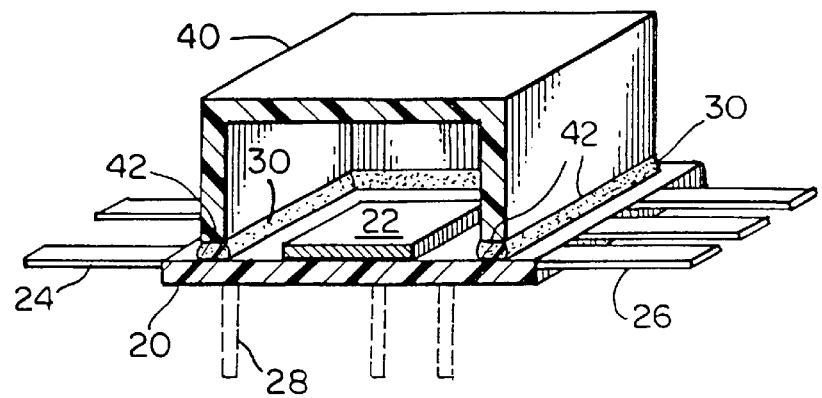
FIG. 1 is a cut-away perspective view of an electronic device including an embodiment according to the present invention.

In the Drawing, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. Similarly, similar elements or features may be designated by like alphanumeric designations in different figures of the Drawing and with similar nomenclature in the specification, but in the Drawing are preceded by digits unique to the embodiment described. For example, a particular element may be designated as "xx" in one figure, by "1xx" in another figure, by "2xx" in another figure, and so on. It is noted that, according to common practice, the various features of the drawing are not to scale, and the dimensions of the various features are arbitrarily expanded or reduced for clarity.

DESCRIPTION OF THE PREFERRED EMBODIMENTS

FIG. 1 is a cut-away perspective view of an electronic device 10 including an electronic substrate 20 upon which are mounted one or more electronic components 22, such as optical devices, semiconductor chips, integrated circuits, transistors, diodes, resistors, capacitors, inductors, and combinations thereof. The electronic devices are connected in circuit by electrical conductors (not visible in FIG. 1) formed on or within substrate 20, as is known to those having ordinary skill in the art. Electrical leads 24, 26 extending outwardly from substrate 20 as in a "flat-pack" arrangement, for example, provide conductive connections between the electrical conductors and components 22 of electronic device 10 and the apparatus to which electronic device 10 is incorporated.

Because electronic components 22 commonly include very fine features that are delicate and susceptible to damaged by mechanical and electrical means, and/or are susceptible to contamination by moisture or other foreign matter, a protective lid or cover 40 is attached over and protecting electronic components 22. Protective cover 40 is attached to substrate 20 by a continuous line of adhesive 30 that joins the edges 42 of cover 40 to the surface of substrate 20 completely around the periphery thereof. Edges 42 of cover 40 are a bonding surface that define a bonding pattern, wherein the adhesive 30 is deposited in a pattern substantially corresponding in size and shape to that bonding pattern.

Where cover 40 is an optically transparent cover through which light in the visible, ultra-violet and/or infrared wavelengths is to pass to impinge upon or to propagate from optical device 22, such as a laser diode, optical detector, photocell, solar cell, imager, CCD device, programmable electrical memory (EPROM), laser trimmable electronic device, or other electro-optical device, cover 40 is of a material that is optically transmissive of such light, and preferably optically transparent thereto. Suitable optically transmissive materials include glass and plastics such as poly methyl methacrylate (PMMA), polycarbonate or polystyrene.

Where cover 40 is a protective cover only, it may be formed of stamped or cast or molded epoxy, liquid-crystal polymer or other suitable plastic, and adhesive 30 may be a non-electrically conductive thermoplastic adhesive, such as types TP7150, TP7090, TP7750 and TP7260 or a non-electrically conductive thermosetting adhesive, such as types ESP7675, ESP7670 and ESP7450, all of which are available from AI Technology, Inc. located in Princeton, N.J. Suitable adhesives are resistant to the passage of moisture and the degradation of adhesion even under high temperature conditions, as are all of the above adhesives. Surfaces of plastic covers to which adhesive is to be applied are preferably prepared for improved adhesion, such as by oxidizing the bond surfaces by flame or corona treatment. Covers typically range in size from about 100 mils×100 mils, which could be employed to protect an individual transistor or diode or a small integrated circuit, to about one or two inches by one or two inches, which could be employed to protect a large integrated circuit such as a micro-processor.

Where cover 40 is for providing electrostatic and/or electromagnetic shielding of the electronic components it encloses, cover 40 may be coated with a thin layer of an electrically-conductive material, for example, a metal, such as copper, aluminum, indium tun oxide (ITO), silver, gold, and alloys thereof, with and without protective plating, or may be filled with conductive particles such as copper, silver, gold, aluminum and/or carbon particles. In the case where such electrostatic and/or electromagnetic shielding is also provided, adhesive 30 may be an-electrically conductive thermoplastic adhesive, such as types TP8090 (filled with silver particles), TP8093 (filled with silver-plated copper particles) and TP8150 (filled with silver particles) or an electrically conductive thermosetting adhesive, such as types ESP8680 (filled with silver particles), ESP8450 (filled with silver particles) and ESP8453 (filled with silver-plated copper particles), all also available from AI Technology, Inc. Adhesives of the foregoing types are considered flexible adhesives in that they have a modulus of elasticity that is less than about 200,000 psi (about 14000 kg/cm$^2$) over the specified and/or operating temperature range of the electronic devices 22 with which covers 40 are intended to be employed, and also will elongate by at least 10% before fracturing. For example, type ESP8450 adhesive has a modulus of elasticity between about 200,000 psi and 20,000 psi (about 14000 and 1400 kg/cm$^2$) over the temperature range of about −55° C. to +150° C. It is noted that covers 40 formed with the foregoing materials and employing adhesive preforms 30 of the foregoing exemplary materials will be resistant to the passage of moisture and chemical cleaners and solvents commonly employed in the manufacture of electronic devices, such as isopropyl alcohol, volatile methylsiloxane, terpenes and other solvents. The adhesive preforms 30 will exhibit volume resistivity in a range of about 100 million ohm-cm to about 0.1 ohm-cm, depending upon the adhesive material and the fillers therein, if any, and so will tend to dissipate electrostatic potential.

Figure 2:
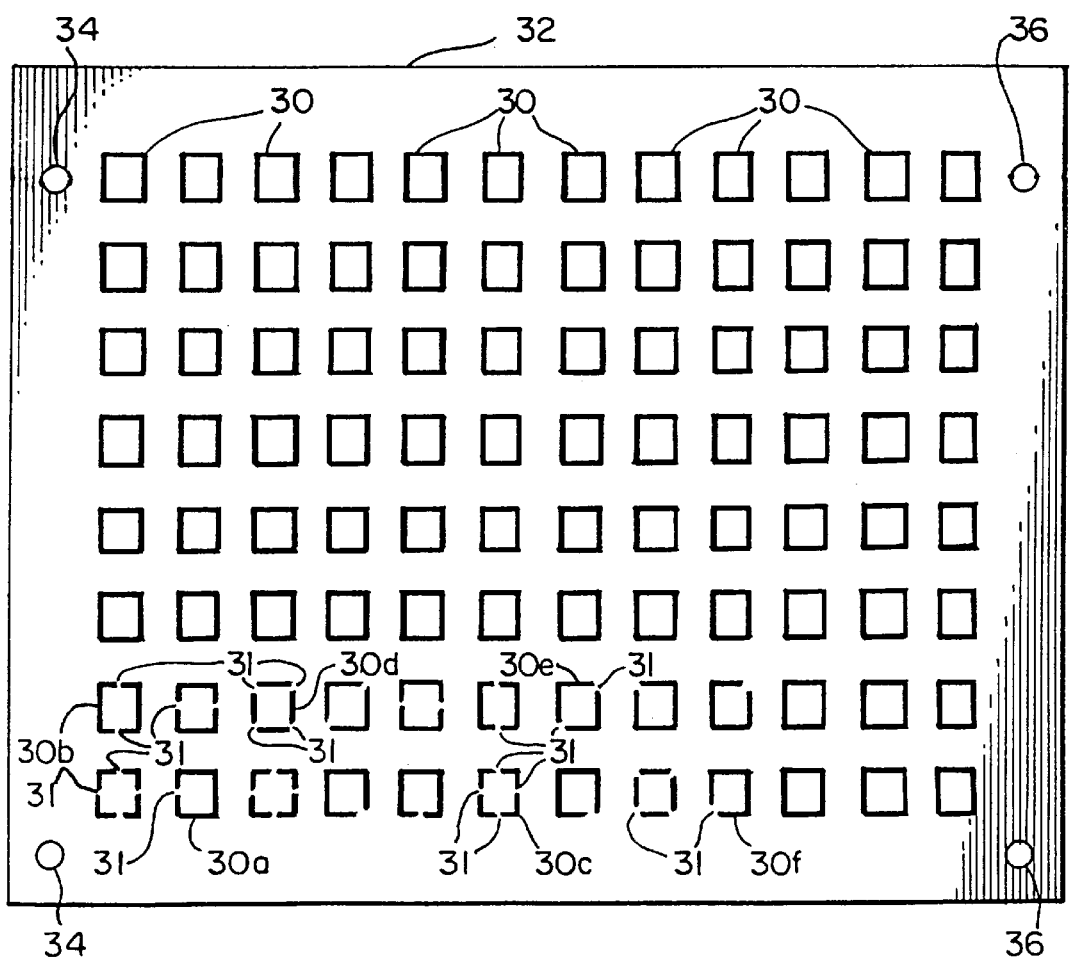
FIG. 2 is a plan view of a plurality of adhesive preforms on a release substrate.

In accordance with the present invention, covers 40 with preformed adhesive 30 applied thereto are made by the following method which is described in relation to FIG. 2. A release substrate 32 such as a sheet of steel coated with a layer of poly-tetra-fluoro-ethylene, such as Teflon®, available from E.I. duPont de Nemoirs located in Wilmington, Del., is obtained and a set of at least two relational alignment holes 34, 36 are made therein, as by punching, die cutting or laser cutting. Release substrate 32 may also employ polypropylene plate, and, if a mechanically self supporting release substrate is desired, it may be made of a self-supporting sheet of low surface energy (e.g., surface energy less than 30 dyne/cm) material such as poly-tetra-fluoro-ethylene or may be made of aluminum, stainless steel, steel or other metal and coated with such low surface energy material. The relational alignment holes 34, 36 are located in known predetermined relationship to each other, as may be seen in the plan view of FIG. 2.

A flexible adhesive is deposited on release substrate 32 to form a pattern of a plurality of adhesive preforms 30 conforming substantially to the bonding pattern defined by edges 42 of cover 40, in positions determined by the relational alignment holes 34', 36' in the screen, stencil or mask employed to deposit the flexible adhesive, which relational alignment holes 34', 36' are in the same known predetermined relationship to the pattern of adhesive preforms 30 as are the corresponding relational alignment holes 34, 36 in release substrate 32. Deposition of flexible adhesive may be accomplished by mesh screening, stencil screening, contact screening, mask screening ink-jet printing or other suitable method. Flexible adhesive preforms 30 are formed of a deposition of flexible adhesive that may be electrically insulating or electrically conductive, or may be of a thermoplastic or thermosetting adhesive type, as set forth above. Each adhesive preform 30 has a shape that corresponds to the bonding pattern defined by the shape of the edges 42 of the cover or lid 40 that is to be attached to an electronic substrate. For example, if the cover 40 is in the form of a hollow rectangular solid, as is illustrated in FIG. 1, adhesive preform 30 is in the shape of a rectangle as is illustrated in FIG. 2, and if the cover 40 is in the form of a hollow cylinder (not illustrated), adhesive preform 30 is in the shape of a circle.

Each adhesive preform 30 is relatively thin because it need only contain sufficient adhesive to form a bond between a cover 40 and a substrate 20 when they are pressed together in assembling an electronic device. Release substrate 32 with the pattern of wet adhesive preforms 30 thereon is ready to receive covers 40 on the respective wet preforms 30.

Covers 40 may be placed on adhesive preforms 30 utilizing a guide plate having a pattern of receptacles therein corresponding to the pattern of adhesive preforms 30 on release substrate 32. Each receptacle is adapted for releasably receiving a cover 40 therein, and the guide plate preferably has a set of relational alignment holes therethrough located to correspond to the set of relational alignment holes 34, 36 in release substrate 32 and in the same known relationship to the pattern of receptacles as are relational alignment holes 34, 36 to the pattern of adhesive preforms 30. The guide plate is placed over release substrate 32 so that the receptacles in the guide plate are in direct correspondence in shape and size to the adhesive preforms 30, preferably passing an alignment pin through each of the corresponding pairs of respective relational alignment holes 34, 36 and, also preferably, the receptacles may be several thousandths of an inch larger than the size of covers 40 to allow easy placement thereof. The covers 40 are then placed directly on top of the wet adhesive preforms 30 through the receptacles in the guide plate. After all of the covers 40 have been placed on adhesive preforms 30, the guide plate is removed, producing covers 40 with adhesive preforms 30 thereon. Release substrate 32 with the covers 40 on the adhesive preforms 30 is dried or B-staged, for example, in a belt oven or a box oven, for a time sufficient to remove solvent from the adhesive and/or for some chemical cross-linking of the adhesive to occur, whereby the wet adhesive preforms 30 become solid adhesive preforms 30, each one attached to a respective one of the covers 40.

Covers 40 with dried adhesive preforms 30 thereon may then be released from the release liner 32 and are ready to be used, for example, in attachment onto a substrate of an electronic or other functional device. Alternatively, covers 40 with adhesive preforms 30 thereon may be packaged in either tape-and-reel or waffle packaging for ease of transportation and storage for later use, for example, with conventional "pick-and-place" apparatus.

Alternatively, release substrate 32 may be employed with conventional "pick-and-place" apparatus in two different ways. Firstly, release substrate 32 with wet adhesive preforms 30 thereon as shown in FIG. 2 may be transferred to a pick-and-place apparatus, such as a model ECM 93 pick-and-place machine available from Manncorp located in Huntingdon Valley, Pa., which then picks up individual covers 40 and places one on each of the adhesive preforms 30 on release substrate 32, thereby also producing covers 40 with adhesive preform 30 thereon. Release substrate 32 containing the wet adhesive preforms 30 is then processed as described above. Secondly, release substrate 32 with covers 40 attached thereto by dried adhesive preforms 30 may be transferred to a pick-and-place apparatus, such as the Manncorp model ECM 93, which apparatus then picks up each cover 40 with dried adhesive preform 30 attached thereto and places it in the predetermined location on the substrate of an electronic or other functional device. In either of the foregoing ways of utilizing release substrate 32 with pick-and-place apparatus, release substrate 32 may be positioned on such pick-and-place apparatus by employing the relational alignment holes 34, 36 therein, whereby the location of each adhesive preform 30 and/or of each cover 40, as the case may be, on the pick-and-place apparatus is determined precisely.

Figure 3:
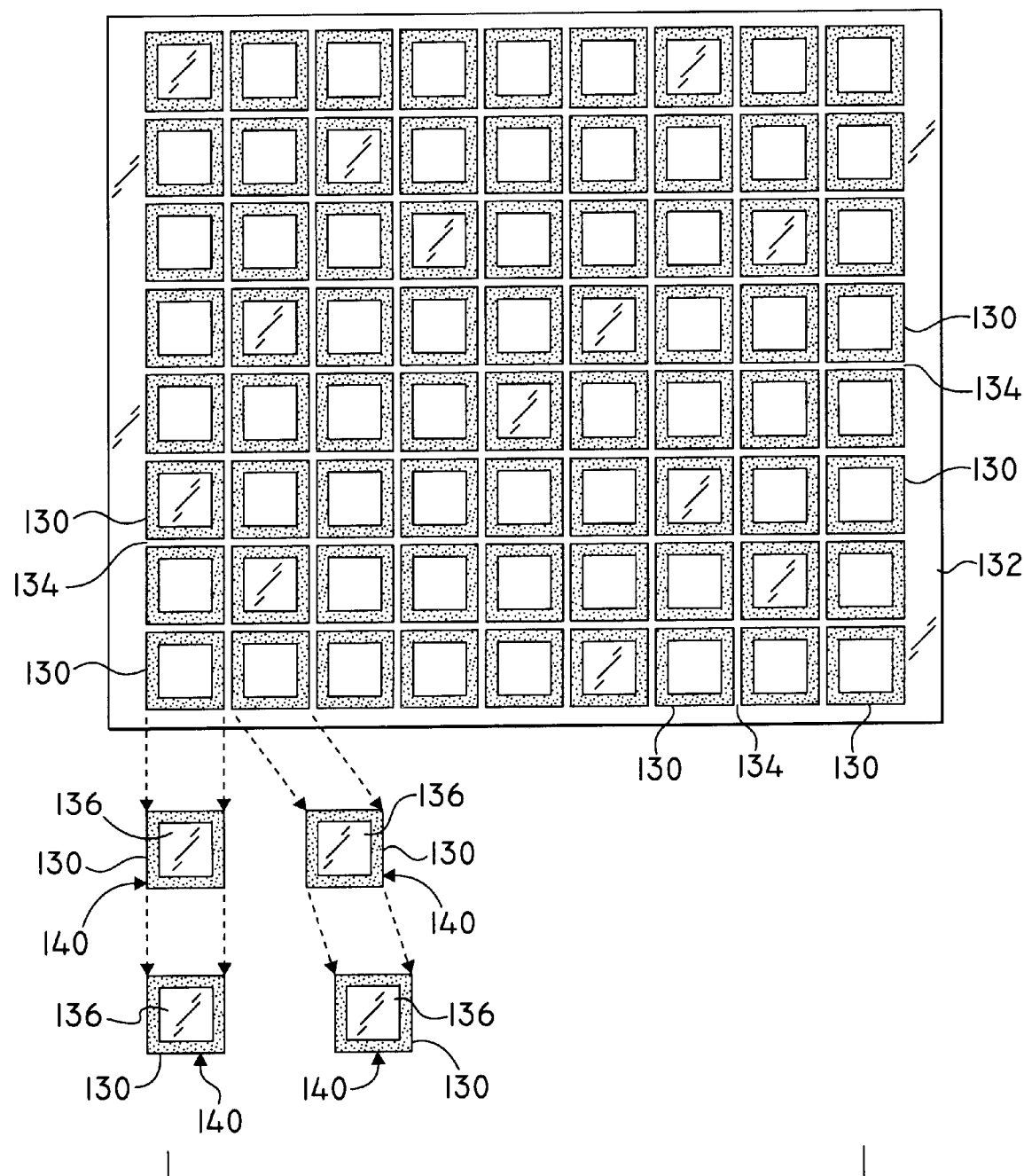
FIG. 3 is a schematic plan view of a plurality of exemplary adhesive preforms on an optically transparent substrate and of singulated covers therefrom, according to an aspect of the present invention.

FIG. 3 is a schematic plan view of a plurality of exemplary adhesive preforms 130 on an optically transparent substrate 132 and of singulated covers 140 therefrom, according to an aspect of the present invention. A sheet of optically transmissive material 132 is provided. Sheet 132 is preferably substantially flat or planar, and of suitable thickness, and is optically transmissive or transparent, such as a sheet of glass or transparent plastic. A pattern of adhesive preforms 130 is deposited on transparent sheet 132. Preforms 130 may be deposited by any convenient method including screening, stenciling, mask deposition, ink-jet printing, laminating and the like. Alternatively, adhesive preforms 130 may be deposited by a suitable automated liquid dispenser, such as a computerized numerically controlled (CNC) type dispenser which is controls the pattern and volume of adhesive dispensed. Suitable CNC equipment is commercially available, such as from the Camelot company located in Franklin, Mass. Each preform 130 is preferably spaced away from each other preform 130 adjacent thereto by a gap or dicing channel 134 of sufficient width to allow passage of a dicing saw blade without damage to preforms 130. Preferably, dicing channel 134 is slightly oversized to allow for the flowing of the adhesive of preforms 130 when the individual covers including same are applied to a substrate or package as described below.

After adhesive preforms 130 are dried or B-staged, glass substrate 130 is diced or singulated using a conventional dicing saw of the sort utilized for dicing or singulating a semiconductor wafer into individual semiconductor die in known manner. In the case of a glass substrate 132, the dicing or cutting saw must utilize a proper blade, such as a diamond tipped blade, and be operated at a rotational speed and at an advance rate to give a clean cut. The result of such singulation (indicated by the dashed arrows in FIG. 3) is a plurality of individual optical covers 140 each being a substantially flat or planar piece 136 of optically transmissive material with an adhesive preform 130 thereon. It is noted that a releasable but tacky tape may be applied to glass or plastic sheet 132 prior to dicing, both for holding sheet 132 for dicing and for covering sheet 132, even including preforms 130, to reduce the accumulation of cutting debris thereon and reduce post-cutting clean up. Dicing tape should be moisture and water resistant so as not to separate or delaminate from the wafer during the dicing operation. Suitable dicing tapes include, for example, types WM-50 and WMR-1000 both available from AI Technology.

The foregoing method lends itself to high-volume production of optical lids 140 at an economical cost because the preforms 130 for all the lids produced from a sheet of optical material 132 are formed contemporaneously and inexpensively, and the handling and applying of adhesive to each cover individually is eliminated.

Figure 4:
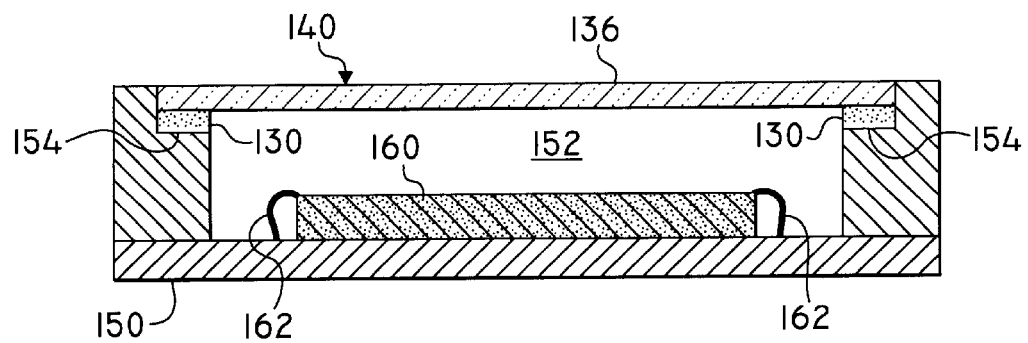
FIGS. 4 and 5 are side cross-sectional schematic diagrams of exemplary optical device packages utilizing the adhesive preform lids or covers of FIG. 3, according to an aspect of the present invention.

FIG. 4 is a side cross-sectional schematic diagram of an optical device 160 in an exemplary package 150 utilizing the adhesive preform lids or covers 140 of FIG. 3, according to an aspect of the present invention. Package 150, which may be of metal, ceramic or other suitable material, has a cavity 152 into which a device, such as an electronic device or optical device 160 is mounted, such as by eutectic solder or die-attach adhesive. Device 160 is electrically connected to package 150 via bond wires 162 and package 150 typically includes external electrical leads (not shown) in conventional manner. Package 150 further includes a recessed shoulder 154 around the periphery of cavity 152 onto which cover 140 is placed to enclose and seal cavity 152 and optical device 160 therein. Cover 140 and/or package 150 is heated to a temperature at which adhesive preform 130 of cover 140 melt flows and cover 140 is pressed into place on shoulder 154 to be adhesively tacked and/or bonded thereto. Light passes to or from optical device 160 in package 150 through the cover layer 136 of optically transmissive or transparent material. Typically, glass 136 is of high optical quality and the adhesive of preform 130 provides a seal against the entry of moisture into package 150, consistent with the requirements for optical device 160, such as a CCD or CMOS semiconductor optical sensor.

Figure 5:
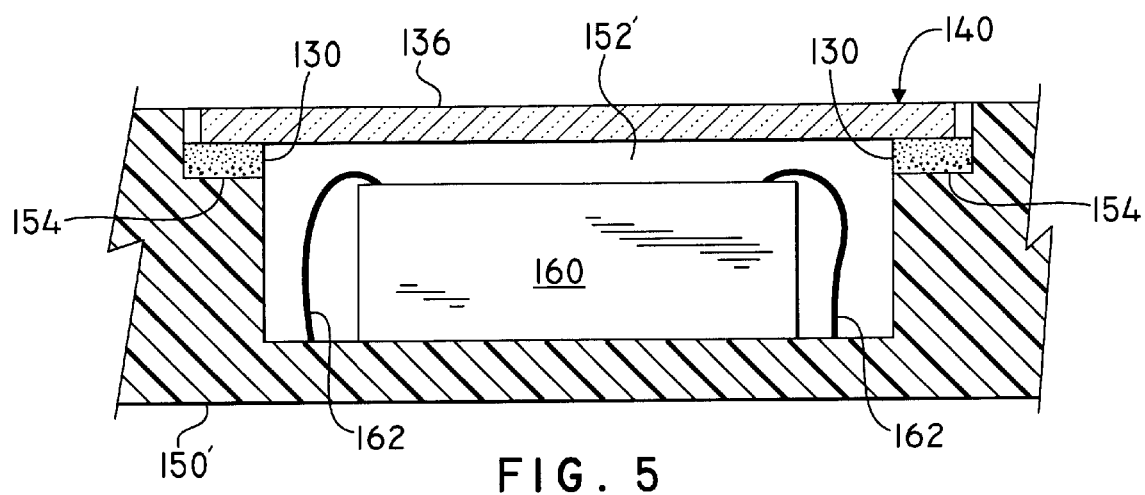

FIG. 5 is a side cross-sectional schematic diagram of an optical device 160 packaged in an exemplary substrate 150' utilizing the adhesive preform lids or covers 140 of FIG. 3, according to an aspect of the present invention. Substrate 150', which may be of metal, ceramic, fiberglass laminate, or other suitable material, has a cavity 152' into which a device, such as an electronic device or optical device 160 is mounted, such as by eutectic solder or die-attach adhesive. Device 160 is electrically connected to substrate 150' via bond wires 162. Substrate 150' may be a laminated substrate having plural layers of insulating material with patterns of electrical conductors on the surfaces of the insulating layers, such as a so-called multi-layer printed circuit board, and typically includes external electrical connections (not shown) in conventional manner. Substrate 150' further includes a recessed shoulder 154 around the periphery of cavity 152' onto which cover 140 is placed to enclose and seal cavity 152' and optical device 160 therein. Cover 140 and/or substrate 150' is heated to a temperature at which adhesive preform 130 of cover 140 melt flows and cover 140 is pressed into place on shoulder 154 to be adhesively tacked and/or bonded thereto. Light passes to or from optical device 160 in substrate 150' through the cover layer 136 of optically transmissive or transparent material.

Figure 6:
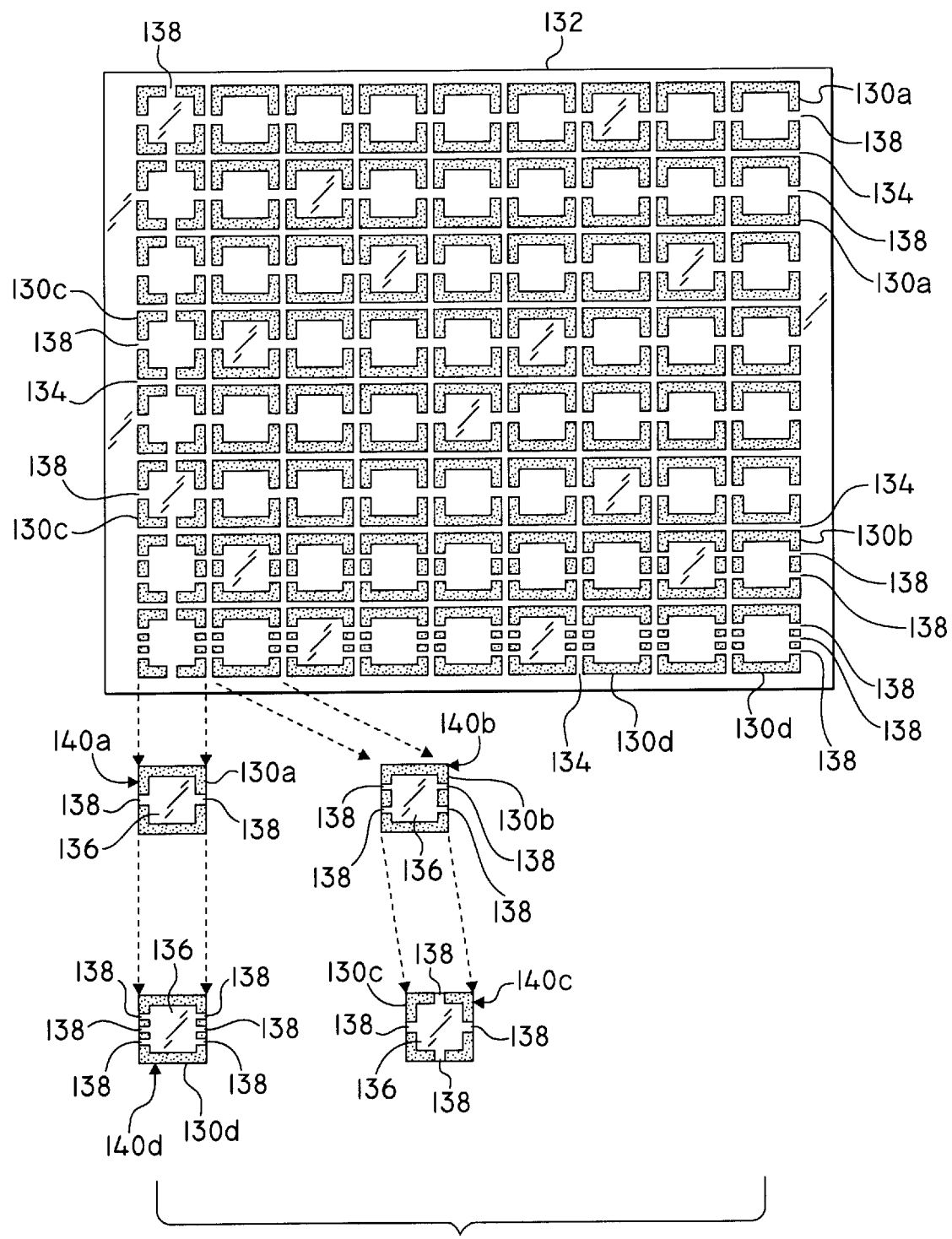
FIG. 6 is a schematic plan view of a plurality of preferred exemplary adhesive preforms on an optically transparent substrate and of singulated covers therefrom, according to an aspect of the present invention.

In addition, adhesive preform covers according to the present invention advantageously may be employed to avoid the so-called "blow-out" problem caused by gas trapped in the interior of a cavity 152 by a lid or cover that, when heated during the lid attachment process, ruptures the adhesive attachment between the lid 140 and the package, thereby causing a failure in the adhesive seal between the cover 140 and the package 150 or substrate 150'. To this end, preforms 130a, 130b, 130c, 130d are formed having one or more gaps or vent holes therein, as shown in FIG. 6, through which gas may bleed or flow. It is noted that substrate as used herein is intended to include a substrate including electronic substrates and circuit boards, an electronic or other package, and any other object on which an optical cover is placed.

FIG. 6 is a schematic plan view of a plurality of preferred exemplary adhesive preforms 130a, 130b, 130c, 130d on an optically transparent substrate 132 and of singulated covers 140a, 140b, 140c, 140d therefrom, according to an aspect of the present invention. A flat sheet of optically transmissive material 132, such as a sheet of glass, optical glass or transparent plastic, is provided and a pattern of adhesive preforms 130a, 130b, 130c, 130d is deposited thereon by any convenient method, as described above in relation to FIGS. 2 and 3. Each preform 130a, 130b, 130c, 130d is preferably spaced away from each other preform 130a, 130b, 130c, 130d adjacent thereto by a gap or dicing channel 134 of slightly greater width than necessary to allow passage of a dicing saw blade without damage to preforms 130a, 130b, 130c, 130d, i.e. the spacing between adjacent adhesive preforms 130a, . . . is larger than the kerf of the dicing saw. After adhesive preforms 130a, 130b, 130c, 130d are dried or B-staged, glass substrate 132 is diced or singulated in like manner to conventional dicing of a semiconductor wafer to produce (as indicated by the dashed arrows in FIG. 6) a plurality of individual optical covers 140a, 140b, 140c, 140d each being a substantially flat or planar piece 136 of optically transmissive material with a respective adhesive preform 130a, 130b, 130c, 130d thereon, all in like manner to that described above.

Covers 140a, 140b, 140c, 140d and adhesive preforms 130a, 130b, 130c, 130d, respectively, attached thereto differ from covers 140 and preforms 130 of FIG. 3 in that each preform 130a, 130b, 130c, 130d has one or more narrow gaps or vent holes 138 therein on one or more sides thereof. For example, adhesive preform 130a has one gap 138 in each of two opposing sides thereof, whereas adhesive preform 130b has four gaps 138, two in each of two opposing sides thereof. Adhesive preform 130c also has four gaps 138, one in each of the four sides thereof. Similarly, adhesive preform 130d has three gaps in each of the two opposing sides thereof. Each gap 138 is narrow, being sufficient to permit entrapped gas molecules to pass, but is narrow enough to be closed by the flowing of the adhesive of preform 130 when cover 140a, 140b, 140c, 140d is heated and pressed against a package 150 or substrate 150' by heating and pressing against substrate 20.

Segmented adhesive preforms 130a, 130b, 130c, 130d, are easily fabricated with covers 140a, 140b, 140c, 140d by employing the method of the present invention because such preforms are deposited by accurate processes on a sheet 132 of optically transmissive material and covers 140a, 140b, 140c, 140d are singulated therefrom. Gaps 138 are formed when the adhesive is deposited to form preforms 130a, 130b, 130c, 130d. Thereafter, covers 140a, 140b, 140c, 140d with adhesive preform 130a, 130b, 130c, 130d, attached is easily handled by pick-and-place equipment. To attempt to form such gapped adhesive preform 130a, 130b, 130c, 130d, by conventional methods which require handling of the preform would be extremely difficult, if not impossible, due to the small size and delicacy of the preform alone.

A further advantage of gapped preforms 130a, 130b, 130c, 130d accrues where such preforms are deposited by stenciling, wherein the stencil portions that define the interior area of preforms 130a, 130b, 130c, 130d are supported by the stencil portions that define gaps 138 while maintaining the proper aspect ratio of the stencil opening size to thickness and providing the desired strength and integrity of the stencil.

Figure 7:
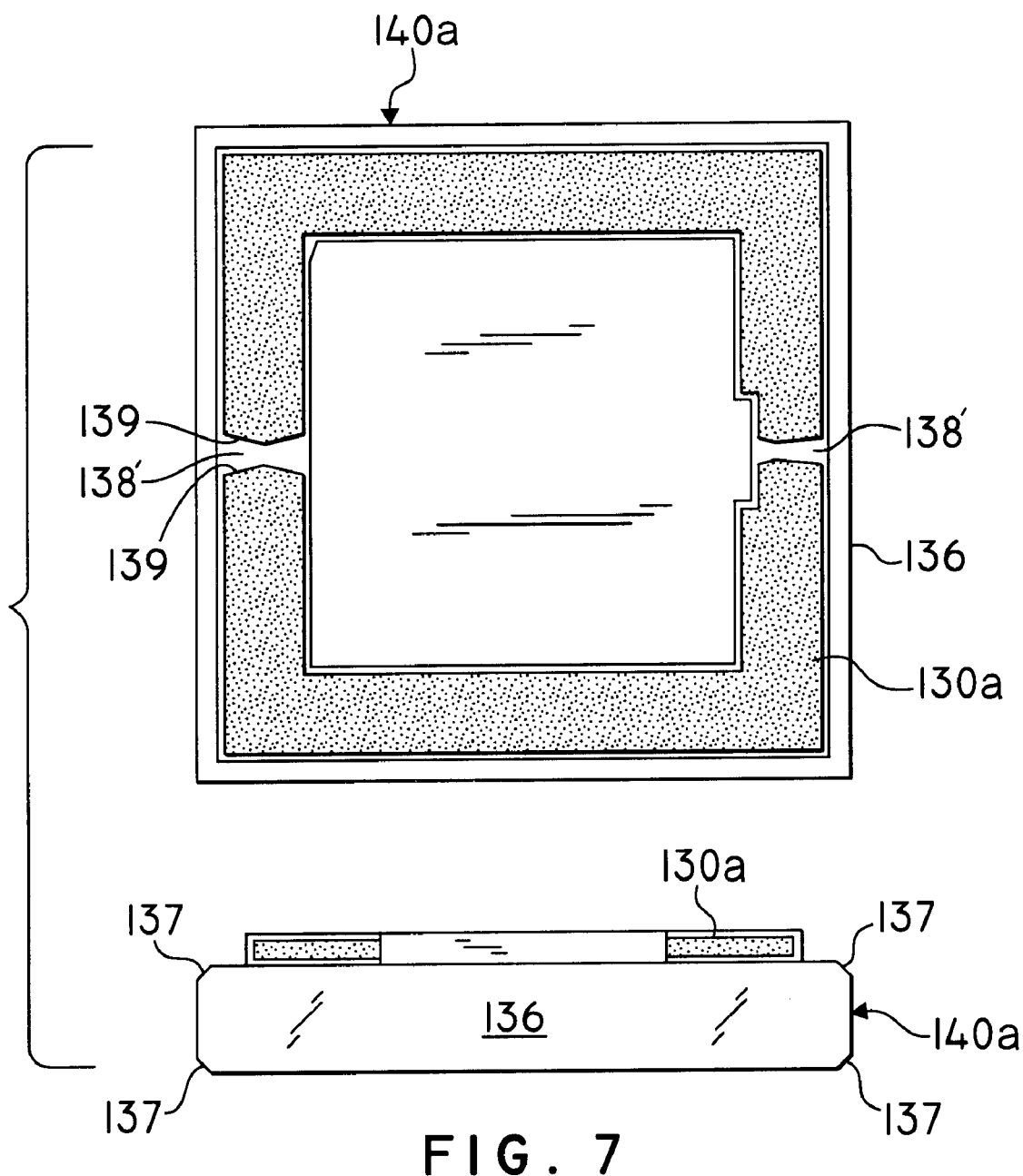
FIG. 7 is a schematic plan view and side view of a preferred embodiment of a cover for an optical device according to an aspect of the present invention.

FIG. 7 is a schematic plan view and side view of a preferred embodiment of a typical cover 140a for an optical device according to an aspect of the present invention. Adhesive preform 130a on a broad surface of optical glass layer 136 has two gaps or vent holes 138' on each of two opposing sides thereof. Gaps 138' are preferably of non-uniform width with the adhesive of preform 130a being formed to have projections 139 projecting into gap 138 so that gap 138' is narrower at the center or middle thereof than at the ends thereof. Thus, each edge of gap 138 may be said to be serrated. A result of such shaped vent hole 138' is that when cover 140a is attached to a package 150 or substrate 150', the adhesive of preform 130 melt flows and projections 139 join together to close vent hole 138 and to more consistently provide a stronger bond and better seal between cover 140a and package 150 or substrate 150'.

It may also be desirable to provide a chamfer 137 on the corner edges of glass 136 of cover 140a or any other cover described herein. In such case, the street or space 134 between adjacent adhesive preforms 130 on optical substrate 132 is made wider to accommodate a larger width saw blade that cuts the chamfer, i.e. the spacing between adjacent adhesive preforms 130 is larger than the kerf of the chamfer-cutting saw. First, the wider chamfer cutting blade is utilized to cut to a certain depth to cut the chamfers 137, and then a narrower cutting blade is utilized to cut completely through optical substrate 132 to singulate the individual covers 140 therefrom. Where optical substrate 132 is about 0.5–0.75 mm (about 20–30 mils) thick, the chamfer blade cut may be about 0.075–0.25 mm (about 3–10 mils) deep. Where chamfers are desired on the edges of both of the broad surfaces of glass 136, the wider chamfer cutting blade is utilized to cut a chamfer depth cut on each side of optical substrate 132 before it is cut through to singulate individual covers 140. Substrate 132 is held for cutting, for example, by conventional tacky dicing tape as is utilized in singulating semiconductor wafers.

Accordingly, a cover for an optical device comprises a planar sheet of an optically transmissive material having a central region shaped and sized to be at least as large as an optical device to be covered and having a peripheral region surrounding the central region. A closed bonding pattern of adhesive in the peripheral region of the planar sheet of optically transmissive material has at least one gap therein, the width of the gap being sufficiently small as to close when the adhesive is caused to melt flow. The at least one gap is shaped to be of nonuniform width, for example, where at least one edge of the at least one gap is serrated.

Adhesive preforms 130, 130a, 130b, 130c, 130d may be formed by depositing a suitable adhesive that can be B-staged. The adhesive may be thermoplastic or thermosetting, as desired. Suitable B-stageable insulating epoxy paste adhesives include types ESP7675-HF, LESP7670 and ESP7450, and suitable B-stageable thermoplastic adhesives include type TP7150, available from AI Technology, Inc. of Princeton, N.J. Typically, a square adhesive preform 130, . . . that is about 9 mm (about 0.35 inch) long on each side could have sides that are about 1 mm (about 40 mils) wide and about 0.075–0.10 mm (about 6–8 mils) thick, and each of the gaps 138 would be about 0.125 mm (about 5 mils) across.

Following adhesive deposition, optical substrate 132 with adhesive preforms 130, . . . thereon is placed in a belt oven or box oven heated to a temperature for a time sufficient to remove solvent from adhesive preforms 130, . . . and to permit partial chemical cross-linking thereof, so that wet adhesive preforms 130, . . . become solid adhesive preforms 130, . . . attached to un-singulated covers 140, . . . . For type ESP7450 adhesive, for example, a temperature of about 60–80° C. for about 30–60 minutes is sufficient. Optical substrate 132 is then singulated to produce individual covers 140, . . .

Covers 140, . . . with adhesive preform 130, . . . attached thereto are pressed against the shoulder 154 of cavity 152 of electronic package 150 or circuit board substrate 150' (as shown in FIGS. 4 and 5) at a temperature of about 150–180° C. for about three to ten minutes with about 10 psi applied pressure, which is sufficient to produce adequate flow of adhesive preform 130, . . . , during the bonding process. Type LESP7670 epoxy adhesive may be used without additional curing. Covers 140 may be easily removed without damaging package 150 or circuit board 150' by concentrating the stress upon the adhesive preform 130, as by pulling the cover, twisting the cover, or prying the cover, and may be facilitated by heating the adhesive preform to a temperature sufficient to reduce its bonding strength.

Cover 140, . . . may be attached with an adhesive preform 130, . . . having a lower bonding strength and yet provide the same mechanical protection. To that end, type LESP7450 B-stageable flexible epoxy paste has an intrinsic bond strength of approximately 2000 psi (about 140 kg/cm$^2$) at ambient temperature, which is less than about 30% of the bond strength of typical high-strength lid seal adhesives, and is flexible (i.e. has a modulus of elasticity of less than about 200,000 psi (less than about 14000 kg/cm$^2$)) over substantially more than half of its specified operating and storage temperature range, for example, a temperature range of −55° C. and 150° C. The bond strength of type LESP7450 adhesive drops to approximately 300 psi (about 21 kg/cm$^2$) at temperatures at or above about 90° C., i.e. a temperature substantially lower than the melting temperature of solder, thereby to allow easier removal of cover 140, . . . by applying torque, prying or other concentration of stress. Ease of removal is a desirable feature, especially for larger covers and covers with larger bonding areas.

Covers 140, . . . may employ an electrically conductive B-stageable flexible thermoplastic adhesive paste, such as type LTP8090 available from AI Technology, Inc., in conjunction with conductively coated optical covers to provide EMI shielding. Such covers 140, . . . are attached onto the package 150 or electronic substrate 150' at a temperature of about 150–180° C. with about 10 psi pressure, thereby to form a Faraday electrostatic shield against EMI leakage. Because type LTP8090 adhesive is a thermoplastic resin having sharp or well-defined melting temperature of about 110° C., covers 140, . . . can be easily removed once the temperature of the bonding areas is raised above that melting temperature. As a result, covers according to the present invention may be easily reworked at temperatures well below the melting point of solder and the maximum temperature that semiconductor and other optical components can withstand, thereby avoiding component degradation or damage.

Conventional isothermal curing or similar curing of thermosetting adhesive preforms 130, . . . is generally undesirable because the time that the covers 140, . . . and adhesive preforms 130, . . . attached thereto are heated may be too long unless great care is exercised. If the time of pre-attachment heating to a temperature at or near the adhesive curing temperature is too long, the adhesive may gel too much or may partially cure and so not have sufficient strength to properly bond to substrate 150, 150'. Accordingly, it is desirable that the attachment bonding process employed with the adhesives selected for the adhesive preforms 130, . . . of the present invention be improved over that of the prior art.

In an improved cover attachment process, package/substrate 150, 150' is preheated to a substantially higher temperature than are covers 140, . . . . For example, package/substrate 150, 150' may be heated to about 150–200° C., i.e. a temperature sufficiently high to tack thermosetting adhesive preforms 130, . . . while covers 140, . . . with thermosetting adhesive preforms 130, . . . attached thereto are maintained at ambient temperature or an elevated temperature less than about 80° C. Covers 40, 40' with pre-applied thermosetting adhesive preforms 130, . . . attached thereto may be placed onto the preheated package 150 or circuit substrate 150' by a standard pick-and-place apparatus and, upon placement, covers 140, . . . having adhesive preforms 130, . . . are heated by and become tacked to package/substrate 150, 150'. Then package/substrate 150, 150' may be placed in a heating belt oven for about an additional 3–5 minutes at a temperature slightly below that of the package/substrate 150, 150' preheat station. For example, package/substrate 150, 150' may be preheated to about 175° C. and may be cured subsequent to cover 140, . . . attachment in a belt-oven for an additional three minutes at about 150° C.

In the case of thermoplastic adhesive preforms 130, . . . , post-attachment curing is not necessary and the only temperature requirement on the process for attaching cover 140, . . . to package/substrate 150, 150' is that the thermoplastic adhesive preform 130, . . . be heated to the melt-flow temperature of the thermoplastic adhesive. The necessary heat can be provided by preheating covers 140, . . . or by the transfer of heat from the preheated package/substrate 150, 150' to covers 140 . . . It is preferred to preheat covers 140, . . . to a temperature substantially above the melt-flow temperature of the thermoplastic adhesive preforms 130, . . . and to then press covers 140, . . . against the warm package/substrate 150, 150' that may be at a temperature about 50–100° C. below the temperature of covers 140 . . . The temperature differential causes rapid cooling of the thermoplastic adhesive preforms 130, . . . immediately following pressing of covers 140, . . . against package/substrate 150, 150', thereby promoting rapid setting of the thermoplastic adhesive.

Thus, covers or covers 140, . . . are attached to an electronic package 150 or circuit substrate 150 at a high rate, for example, one per second, and by employing automated assembly equipment of a kind presently available in most modern manufacturing facilities. This result is obtained with thermoplastic and thermosetting adhesives, and with electronic circuit modules, flip-chip modules, and printed wiring circuit boards whether receiving one or a large number of covers or lids attached thereto. The covers with adhesive preforms attached thereto according to the present invention applied in the foregoing manner may be of the same or different size and shape, may be of the same or different material, and may provide physical protection and/or electrostatic or electromagnetic protection.

While the present invention has been described in terms of the foregoing exemplary embodiments, variations within the scope and spirit of the present invention as defined by the claims following will be apparent to those skilled in the art. For example, the adhesives of which preforms 30, 30' are formed may be filled with certain materials to tailor their characteristics to a particular application. Thermal conduction of the adhesive may be increased by the addition of particles of a high-thermal conductivity material, such as alumina ($Al_2O_3$), aluminum nitride (AlN), boron nitride (BN), silicon carbide (SiC), or diamond, which fillers may also be employed to modify the coefficient of thermal expansion thereof. The coefficient of thermal expansion thereof may also be reduced by the addition of particles of glass silicates, for example.

Further, cavity 152, 152' need not have a shoulder onto which a cover 140 is placed and cover 140 can be attached directly to the surface of package 150 ro substrate 150'. In addition, adhesive preforms 130 on covers 140 may have gaps 138 in one, two and four corners thereof, in addition to or in place of one or more gaps 138 in one or more sides thereof, and one or both edges of the gaps may be serrated or otherwise shaped.

What is claimed is:

1. A method for making optical covers having an adhesive preform thereon comprising:
   providing an optical substrate;
   depositing a pattern of adhesive including a plurality of cover bonding patterns on the optical substrate; and
   singulating the optical substrate into a plurality of optical covers each of which has one of the cover bonding patterns of adhesive attached thereto.

2. The method of claim 1 wherein the optical substrate includes a sheet of an optically transmissive material.

3. The method of claim 1 wherein depositing a pattern of adhesive includes depositing an adhesive selected from the group consisting of thermoplastic adhesive, thermosetting adhesive, a blend thereof and a mixture thereof.

4. The method of claim 1 wherein depositing a pattern of adhesive includes depositing an adhesive by a method selected from the group consisting of mesh screening, stencil screening, contact screening, mask screening, ink-jet printing, and controlled dispensing.

5. The method of claim 1 further comprising drying or B-staging the deposited pattern of adhesive.

6. The method of claim 1 further comprising drying or B-staging the deposited pattern of adhesive prior to said singulating the optical substrate.

7. The method of claim 1 wherein said depositing a pattern of adhesive includes depositing cover bonding patterns of adhesive each having at least one gap therein, wherein the gap is sized to be filled by the adhesive when the adhesive flows.

8. The method of claim 1 wherein said singulating the optical substrate includes cutting through the optical substrate with a saw producing a kerf.

9. The method of claim 8 wherein adjacent ones of the cover bonding patterns are separated by a distance at least as large as the kerf.

10. The method of claim 8 further comprising cutting partially through the optical substrate with a chamfer-forming saw prior to said cutting through the optical substrate.

11. The method of claim 1 further comprising placing at least one of the optical covers having the bonding pattern of adhesive attached thereto on a substrate to bond the one of the optical covers to the substrate.

12. The method of claim 11 wherein said placing one of the optical covers includes applying sufficient pressure to cause the adhesive to flow.

13. The method of claim 11 wherein the adhesive is a thermosetting adhesive having a tacking temperature and a curing temperature, further including heating the substrate to at least the tacking temperature to tack the thermosetting adhesive thereto, wherein the one of the optical covers is at a temperature less than the tacking temperature until placed on the substrate.

14. The method of claim 13 further including thereafter curing the thermosetting adhesive at the curing temperature.

15. The method of claim 11 wherein the adhesive is a thermoplastic adhesive having a melt-flow temperature, further including heating the one of the optical covers to at least the melt-flow temperature of the thermoplastic adhesive, wherein the substrate is at a temperature lower than the melt-flow temperature when the one of the optical covers is placed thereon.

16. The method of claim 11 wherein said placing one of the optical covers includes employing pick-and-place apparatus to place one of the plurality of optical covers on the substrate.

17. The method of claim 11 wherein the substrate includes a solder having a melting temperature, and wherein the adhesive has a bond strength that substantially decreases at a temperature less than the melting temperature of the solder.

18. A method for making an optical cover having an adhesive preform thereon comprising:
   providing sheet of an optical substrate material that is one of optically transmissive and optically transparent;
   depositing a pattern of adhesive including a plurality of cover bonding patterns on the sheet of optical substrate material;
   drying or B-staging the deposited pattern of adhesive; and
   singulating from the sheet of optical substrate material at least one optical cover which has one of the cover bonding patterns of adhesive attached thereto.

19. The method of claim 18 wherein depositing a pattern of adhesive includes depositing an adhesive selected from the group consisting of thermoplastic adhesive, thermosetting adhesive, a blend thereof and a mixture thereof.

20. The method of claim 18 wherein depositing a pattern of adhesive includes depositing an adhesive by a method selected from the group consisting of mesh screening, stencil screening, contact screening, mask screening, ink-jet printing, and controlled dispensing.

21. The method of claim 18 wherein said drying or B-staging the deposited pattern of adhesive is prior to said singulating from the sheet of optical substrate.

22. The method of claim 18 wherein said depositing a pattern of adhesive includes depositing cover bonding patterns of adhesive each having at least one gap therein, wherein the gap is sized to be filled by the adhesive when the adhesive flows.

23. The method of claim 18 wherein said singulating from the sheet of optical substrate material includes cutting through the sheet of optical substrate material with a saw producing a kerf.

24. The method of claim 23 wherein adjacent ones of the cover bonding patterns are separated by a distance at least as large as the kerf.

25. The method of claim 23 further comprising cutting partially through the sheet of optical substrate material with a chamfer-forming saw prior to said cutting through the sheet of optical substrate material.

26. The method of claim 18 further comprising placing the optical cover having the bonding pattern of adhesive attached thereto on a substrate to bond the optical cover to the substrate.

27. The method of claim 26 wherein said placing the optical cover includes applying sufficient pressure to cause the adhesive to flow.

28. The method of claim 26 wherein the adhesive is a thermosetting adhesive having a tacking temperature and a curing temperature, further including heating the substrate to at least the tacking temperature to tack the thermosetting adhesive thereto, wherein the optical cover is at a temperature less than the tacking temperature until placed on the substrate.

29. The method of claim 28 further including thereafter curing the thermosetting adhesive at the curing temperature.

30. The method of claim 26 wherein the adhesive is a thermoplastic adhesive having a melt-flow temperature, further including heating the optical cover to at least the melt-flow temperature of the thermoplastic adhesive, wherein the substrate is at a temperature lower than the melt-flow temperature when the optical cover is placed thereon.

31. The method of claim 26 wherein said placing the optical cover includes employing pick-and-place apparatus to place the optical cover on the substrate.

32. The method of claim 26 wherein the substrate includes a solder having a melting temperature, and wherein the adhesive has a bond strength that substantially decreases at a temperature less than the melting temperature of the solder.

33. The method of claim 7 wherein the at least one gap is shaped to be of nonuniform width.

34. The method of claim 22 wherein the at least one gap is shaped to be of nonuniform width.

\* \* \* \* \*